(12) United States Patent
Nissar et al.

(10) Patent No.: US 7,868,706 B2
(45) Date of Patent: Jan. 11, 2011

(54) OSCILLATOR DEVICE AND METHODS THEREOF

(75) Inventors: Arshad I. Nissar, North Chelmsford, MA (US); Jan-Michael Huber, Austin, TX (US); Brian M. Lay, Arlington, MA (US); Kshitij Seth, Nashua, NH (US); Keith Burwinkel, Pflugerville, TX (US); Robert J. Dupcak, Framingham, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 97 days.

(21) Appl. No.: 12/256,736

(22) Filed: Oct. 23, 2008

(65) Prior Publication Data

US 2010/0102891 A1  Apr. 29, 2010

(51) Int. Cl.
*H03K 3/03* (2006.01)
*G11C 29/00* (2006.01)
(52) U.S. Cl. .................. 331/57; 331/44; 365/201
(58) Field of Classification Search ............... 331/57, 331/44; 365/201
See application file for complete search history.

(56) References Cited

U.S. PATENT DOCUMENTS

| 6,144,262 | A | * | 11/2000 | Kingsley | 331/57 |
| 6,535,013 | B2 | * | 3/2003 | Samaan | 324/765 |
| 6,734,744 | B2 | * | 5/2004 | Monzel et al. | 331/57 |

* cited by examiner

*Primary Examiner*—Robert Pascal
*Assistant Examiner*—Ryan Johnson

(57) ABSTRACT

An oscillator device includes a plurality of stages. Each stage is a monostable stage having a delay path, whereby a signal transition of a designated type (rising or falling) at the input of the delay path results in a signal transition at the output of the stage of the same transition type. Each stage of the oscillator device also includes a reset module that causes the output signal to be reset to a nominal state a predetermined period of time after the signal transition of the output signal. Each stage thus provides an output signal pulse in response to the signal transition of the designated type at the input. The output of the final stage of the oscillator device is connected to the input, so that the oscillator output provides an oscillating signal having a period based upon the delay path of each the oscillator device stages.

18 Claims, 5 Drawing Sheets

US 7,868,706 B2

OSCILLATOR DEVICE AND METHODS THEREOF

FIELD OF THE DISCLOSURE

The present disclosure relates to oscillator devices.

BACKGROUND

An oscillator device can be formed as part of an integrated circuit device, such that the characteristics of an output signal provided by the oscillator device are dependent on the manufacturing process and operating characteristics of the integrated circuit device. For example, the frequency, duty cycle, or other characteristics of the output signal can vary based on the process and operating characteristics of the integrated circuit device. The output signal thus provides information that can be analyzed to determine whether the integrated circuit device will perform according to specifications. For example, a potential failure of the integrated circuit device can be indicated by the characteristics of the output signal of the oscillator device failing to match a set of specified characteristics. Analysis of the output signal of the oscillator device thus provides a convenient way to qualify the manufacturing process used to fabricate an integrated circuit device without extensive test and analysis of particular functional modules.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

An oscillator device is disclosed that includes a plurality of stages. Each stage is a monostable stage having a delay path, whereby a signal transition of a designated type (rising or falling) at the input of the delay path results in a signal transition at the output of the stage of the same transition type. Each stage of the oscillator device also includes a reset module that causes the output signal to be reset to a nominal state a predetermined period of time after the signal transition of the output signal. Each stage thus provides an output signal pulse in response to the signal transition of the designated type at the input. The output of the final stage of the oscillator device is connected to the input, so that the oscillator output provides an oscillating signal having a period based upon the delay path of each the oscillator device stages. In an embodiment, the delay path of each stage is based upon the configuration of a functional module of an integrated circuit device, so that the oscillating signal varies based on process and operating characteristics of the functional module. The oscillating signal can therefore be used to predict whether the functional module will match a specification.

Figure 1:
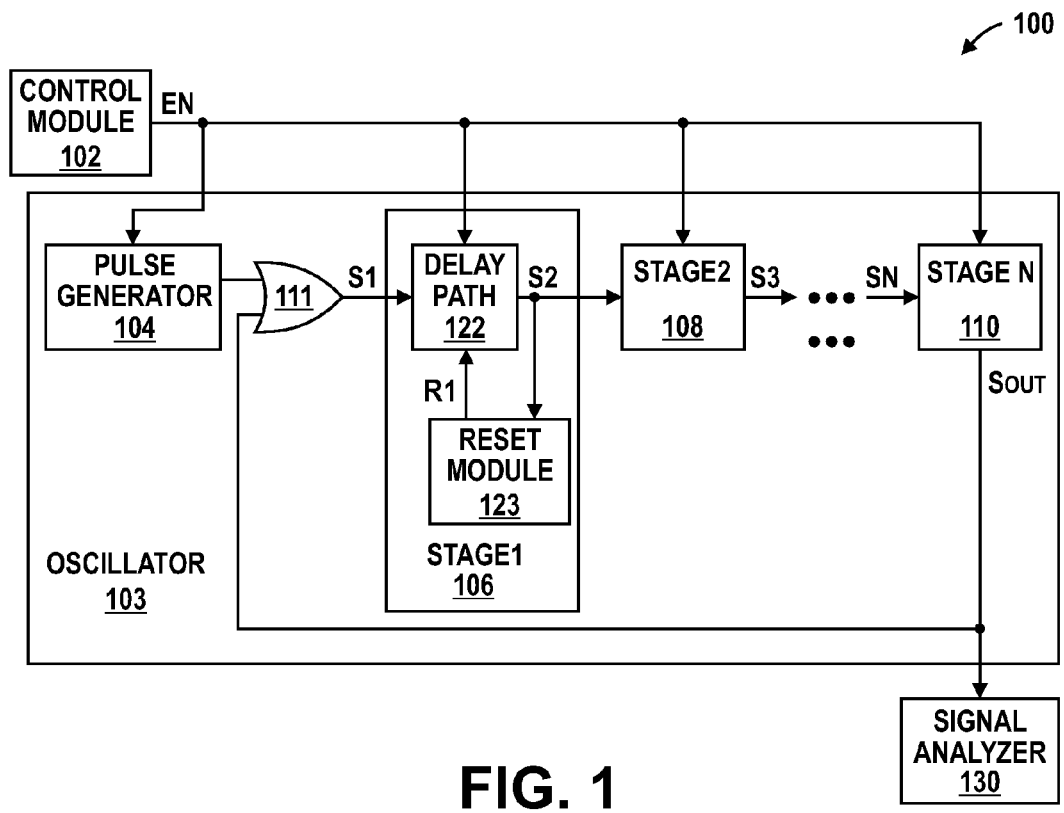
FIG. 1 is a block diagram of an integrated circuit device in accordance with one embodiment of the present disclosure.

Referring to FIG. 1, a block diagram of an integrated circuit device 100 in accordance with one embodiment of the present disclosure is illustrated. Integrated circuit device 100 includes a control module 102, an oscillator device 103, and a signal analyzer 130. The oscillator device 103 includes a pulse generator 104, an OR gate 111, and a plurality of stages, including stage 106 (labeled "STAGE1"), stage 108 (labeled "STAGE2") and additional stages through an Nth stage 110 (labeled "STAGEN"). The control module 102 includes an output to provide an enable signal labeled "EN." The pulse generator 104 includes an input to receive the signal EN and an output. The OR gate 111 includes an input connected to the output of the pulse generator 104, an input to receive a signal labeled "$S_{OUT}$" and an output to provide a signal labeled S1. The stage 106 includes an input to receive the signal EN, an input to receive the signal S1, and an output to provide a signal labeled "S2." The stage 108 includes an input to receive the signal EN, an input to receive the signal S2, and an output to provide a signal labeled "S3." The stage 110 includes an input to receive the signal EN, an input to receive a signal labeled "SN", and an output to provide the signal $S_{OUT}$. The signal analyzer 130 includes an input to receive the signal $S_{OUT}$.

The stage 106 includes a delay path 122 and a reset module 123. The delay path 122 includes an input to receive the signal S1 and an output to provide the signal S2. The reset module 123 includes an input to receive the signal S2 and an output to provide a signal labeled "R1." Each of the stages of the oscillator device 103 are configured similarly to stage 106. For example, stages 108 and 110 each include a delay path (not shown) and a reset module (not shown) configured similarly to the delay path 122 and reset module 123.

Signal analyzer 130 is configured to analyze the signal $S_{OUT}$ to determine characteristics, such as frequency, duty cycle, and the like, of the signal. In an embodiment, signal analyzer 130 can store information indicative of the determined characteristics in memory (not shown) for access by software. In another embodiment, the signal analyzer 130 can communicate the information indicative of the determined characteristics to an external tester via an input/output pin (not shown) of the integrated circuit device 100. It will be appreciated that, in other embodiments, signal analyzer 130 can be an external device to the integrated circuit device 100 that receives the signal $S_{OUT}$ via the input/output pin.

The control module 102 is configured to assert the signal EN in response to specified stimuli. For example, in one embodiment control module 102 can assert the signal EN in response to a specified value being stored at a control register (not shown). In another embodiment, the control module 102 can assert the signal EN in response to a signal being applied to an input/output pin (not shown) of the integrated circuit device 100, indicating the device has been placed in a test mode of operation.

The pulse generator 104 is configured to provide a pulse at its output in response to assertion of the EN signal. In particular, in response to assertion of the EN signal, the pulse generator 104 causes a first transition of a designated transition type in a signal at the output and, after a predetermined period of time, provides a transition of a second type at the output. As used herein, a transition type refers to rising transitions and falling transitions of a signal representative of binary states. Thus, if two signal transitions are referred to as having the same transition type, this indicates that both signal transitions are either rising transitions or falling transitions. Further, a first signal transition is referred to as the opposite of a second signal transition when the first signal transition is of a different type than the second. Thus, a rising transition type is the opposite of a falling transition type.

Delay path 122 is configured to cause a transition of a designated transition type in signal S2 in response to a transition of the same type in signal S1. For purposes of discussion, it is assumed that the designated transition type is a rising transition. The time between the rising transition in the signal S1 and the associated rising transition in the signal S2 is based upon a delay associated with delay path 122. In particular, the delay is determined by the type and configuration of devices that compose delay path 122. Thus, the delay associated with delay path 122 can be set to a desired level by selecting the appropriate type and configuration of devices for delay path 122.

In addition, delay path 122 is configured to cause a transition of another designated transition type in signal S2 in response to assertion of the signal R1. The designated transition type caused by assertion of the signal R1 is the opposite of the transition type that initiated transition of the signal S2. For purposes of discussion, the transition type caused by assertion of the signal R1 is a falling transition type.

Reset module 123 is configured to assert the signal R1 in response to a rising transition of the signal S2 a predetermined period of time after the rising transition. The period of time is determined by the type and configuration of devices that compose reset module 123. Thus, the delay associated with reset module 123 can be set to a desired level by selecting the appropriate type and configuration of devices for reset module 123.

Each of the stages 108 through 110 is configured similarly to the stage 106. In an embodiment, each delay module associated with each of the stages 106-110 is composed of similar devices in a similar configuration, so that each delay path provides substantially the same delay. Similarly, each reset module associated with each of the stages 106-110 is composed of similar devices in a similar configuration, so that each reset module asserts the associated reset signal a similar amount of time after a transition of the associated stage output signal.

Figure 2:
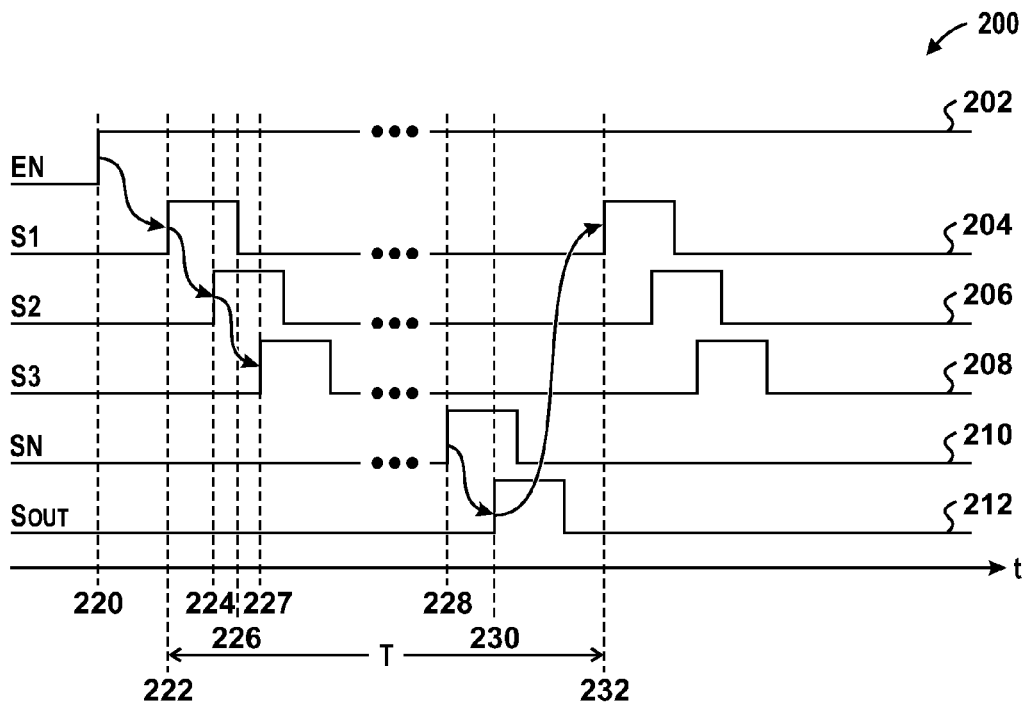
FIG. 2 is a diagram illustrating a particular embodiment of signal waveforms associated with the oscillator device of FIG. 1.

Operation of the oscillator 103 can be better understood with reference to FIG. 2, which illustrates a particular embodiment of signal waveforms associated with the oscillator 103. In particular, waveform 202 represents signal EN, waveform 204 represents signal S1, waveform 206 represents signal S2, waveform 208 represents signal S3, waveform 210 represents signal $S_N$, and waveform 212 represents signal $S_{OUT}$.

In the illustrated example of FIG. 2, signal EN is asserted by the control module 102 at time 220. In response, OR gate 211 causes a rising transition in signal S1 at time 222. In response to the rising transition of signal SI, delay path 122 causes a rising transition in signal S2 at time 224. In response to the rising transition of signal S2, reset module 123 asserts signal R1 (not shown in FIG. 2) a predetermined amount of time after the transition. In response, at time 226, delay path 122 causes a falling transition in signal S2.

In response to the rising transition in signal S2 at time 224, the delay path associated with stage 108 causes a rising transition in signal S3 at time 227. The rising transition of signal S3 causes rising transitions in subsequent stages, eventually causing a rising transition in signal $S_N$ at time 228. In response, the delay path associated with stage 110 causes a rising transition in signal $S_{OUT}$ at time 230. This rising transition is fed back to stage 106 via OR gate 111, causing a rising transition in signal S1 at time 232. The rising transition at time 232 will eventually cause another rising transition in signal $S_{OUT}$, in similar fashion to that described above.

Accordingly, each delay path for stages 106-110, in response to a pulse provided by pulse generator 104, cause a cascaded series of rising transitions at their respective outputs. Further, each reset module for stages 106-110 cause a cascaded series of falling transitions at their respective outputs a predetermined amount of time after the respective rising transition. Accordingly, stages 106-110 provide a cascaded series of pulses, resulting in the oscillating signal $S_{OUT}$. The feedback of $S_{OUT}$ to OR gate 111 ensures that $S_{OUT}$ will continue to oscillate until the EN signal is negated.

The period of oscillation of the signal $S_{OUT}$ can be expressed as follows:

$$T = t_d * N$$

Where T is the period of oscillation, $t_d$ is the delay associated with each delay path (e.g. delay path 122) of the stages 106-110, and N is the number of stages of oscillator 103. In an embodiment, the delay paths and reset modules for each of stages 106-110 are configured so that T is greater than or equal to the pulse width of the pulses triggered by each rising transition. Thus, the delay paths and reset modules for each of stages 106-110 are configured so that T is greater than or equal to the amount of time between time 222 and time 226. In another embodiment, the delay paths and reset modules for each of stages 106-110 are configured so that T is greater than or equal to twice the pulse width.

It will be appreciated that the signal $S_{OUT}$ provided by oscillator 103 can oscillate even when the number of stages N is an even number. Conventional digital ring oscillators require an odd number of stages to achieve a stable oscillating output signal, limiting design capability.

Figure 3:
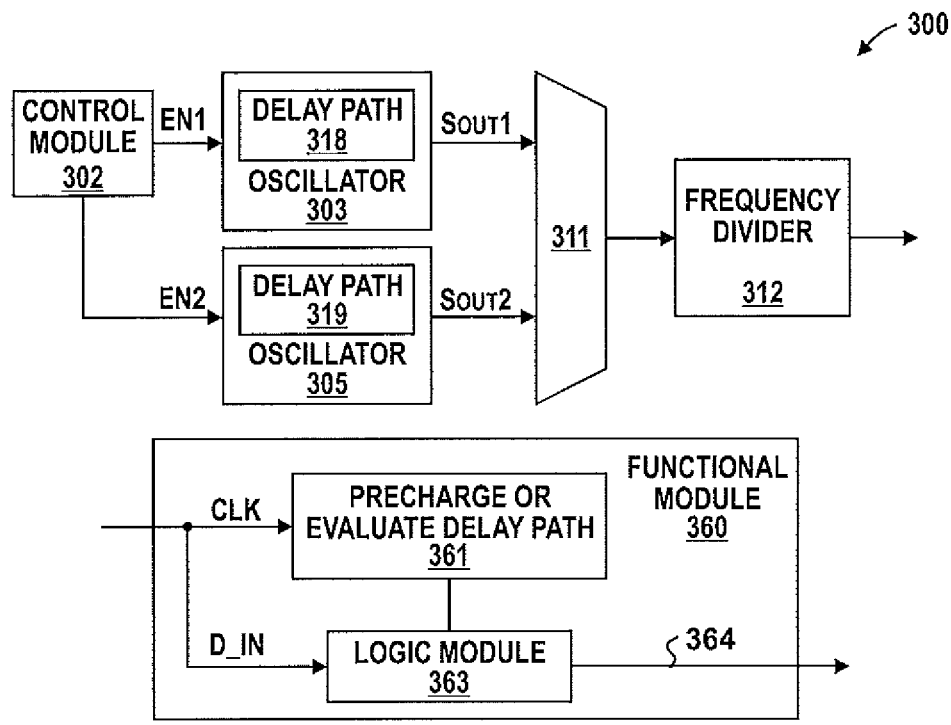
FIG. 3 is a block diagram of an integrated circuit device in accordance with another embodiment of the present disclosure.

Referring to FIG. 3, a block diagram of an integrated circuit device 300 is illustrated in accordance with one embodiment of the present disclosure. The integrated circuit device 300 includes a control module 302, an oscillator 303, an oscillator 305, a multiplexer 311, a frequency divider 312, and a functional module 360 having a precharge or evaluate delay path 361 and a logic module 363. The control module 302 includes an output to provide a dedicated enable signal labeled "EN1", an output to provide another dedicated enable signal labeled "EN2", and an output to provide a control signal. Oscillator 303 includes an input to receive the signal EN1 and an output to provide a signal labeled $S_{OUT1}$. Oscillator 305 includes an input to receive the signal EN2 and an output to provide a signal labeled $S_{OUT2}$. The multiplexer 311 includes an input to receive the signal $S_{OUT1}$, an input to receive the signal $S_{OUT2}$, an input to receive the control signal from the control module 302, and an output. The frequency divider 312 includes an input connected to the output of the multiplexer 311 and an output connected to an input/output pin (not shown) of the integrated circuit device 300. Precharge or evaluate delay path 361 includes an input to receive a clock signal labeled "CLK" and a terminal. Logic module 363 includes an input to receive a signal D_IN, an output connected to a node 364, and a terminal connected to the terminal of the precharge or evaluate delay path 361.

As used herein, a functional module refers to a collection of logic devices, storage devices, and the like, configured to perform a specified function for the integrated circuit device 300. In the example of FIG. 3, logic module 363 includes the logic devices, storage devices, and other elements configured to perform the assigned function of the functional module 360. In the illustrated embodiment, functional module 360 is a dynamic module which can provide data based on phases of the clock signal CLK. In particular, during a precharge phase of the CLK signal precharge or evaluate delay path 361 can configure logic module 363 so that node 364 is set to a designated precharge logic state. In another embodiment, during an evaluate stage of the CLK signal, the precharge or evaluate delay path 361 can configure the logic module 363 so that node 364 is set to a logic state (referred to herein as the "evaluate logic state") based upon the state of the signal D_IN and the configuration of devices that compose logic module 363. For example, in one embodiment logic module 363 can be configured as a storage cell. Accordingly, during the evaluate phase the node 364 can be set to an evaluate logic state representative of data stored at the logic module 363.

Precharge or evaluate delay path 361 is associated with a delay. In an embodiment, the delay associated with the precharge or evaluate delay path 361 is the delay between the time that a precharge phase begins, as indicated by a rising transition of the CLK signal, and the time that the node 364 achieves the designated precharge logic state. In another embodiment, the delay associated with the precharge or evaluate delay path is delay between the time that an evaluate phase begins, as indicated by a falling transition of the CLK signal, and the time that the node 364 achieves the evaluate logic state.

Each of the oscillators 303 and 305 are configured similarly to the oscillator 103 of FIG. 1, and include a plurality of stages having delay paths and reset modules. For example, one stage of oscillator 303 includes a delay path 318, while a stage of oscillator 305 includes delay path 319. In an embodiment, the delay paths 318 and 319 are configured to have different delays, so that the signals SOUT1 and SOUT2 oscillate at different frequencies. Further, the delay paths can be configured to have a delay similar to the delay associated with the pre-charge or evaluate delay path 361. In another embodiment, the delay paths 318 and 319 can be each be associated with different delay paths of one or more functional modules of the integrated circuit device 300.

For example, in one embodiment, delay path 318 is designed so that the configuration of logic devices, storage devices, and the like that compose the delay path are substantially similar to the configuration of a precharge delay path. Further, delay path 318, and other delay paths associated with oscillator 303 can be formed on the integrated circuit die with the precharge delay path, so that all the delay paths experience similar operating and process characteristic variations. Such variations will result in variations to the frequency or other signal characteristics of the signal SOUT1, which can therefore by analyzed to determine the effect of operating and process characteristic variations on the operation of precharge delay path.

Figure 4:
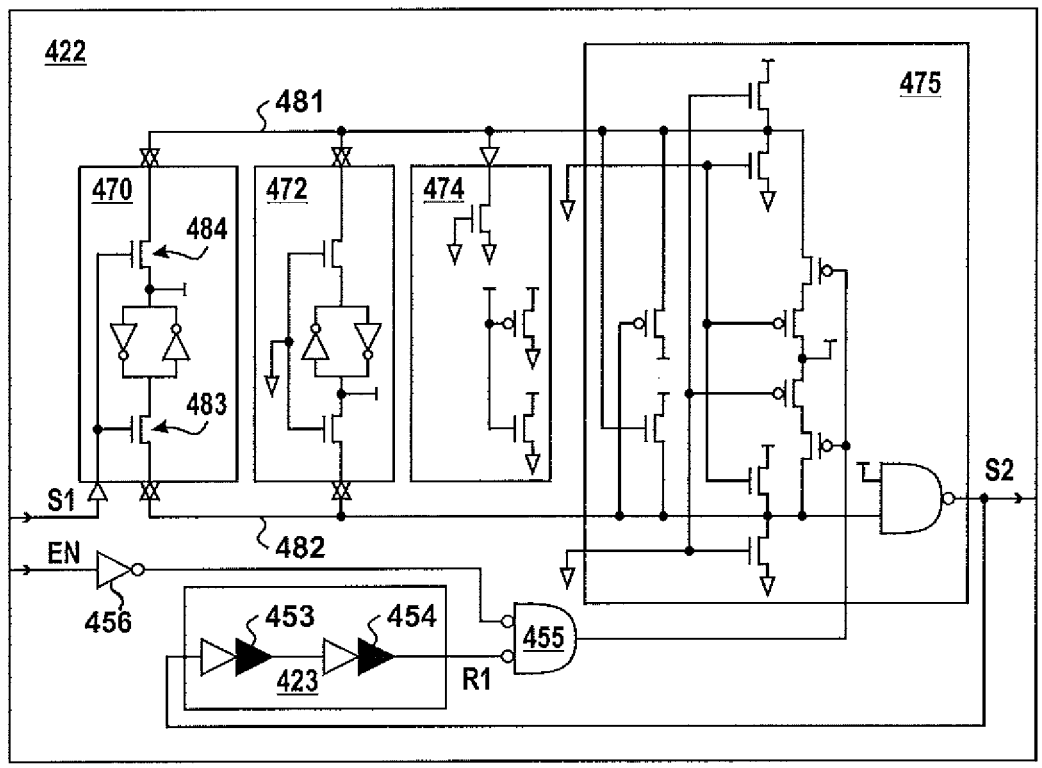
FIG. 4 is a circuit diagram of a delay path of the oscillator device of FIG. 1 in accordance with one embodiment of the present disclosure.

FIG. 4 illustrates a combined block and circuit diagram of a delay path 422, in accordance with one embodiment of the present disclosure. Delay path 422 includes bit cells 470 and 472, a dummy module 474, a precharge module 475, buffers 453 and 454, a NOR gate 455, and an inverter 456. The bit cells 470 and 472 each include a terminal connected to a bit line 481 and each include a terminal connected to a bit line 482. The bit cell 470 includes an input to receive the signal Si. The dummy module 474 includes a terminal connected to the bit line 481. The precharge module 475 includes an input connected to the bit line 481, an input connected to the bit line 482, a precharge input, and an output to provide the signal S2. The inverter 456 includes an input to receive the signal EN and also includes an output. The buffer 453 includes an input to receive the signal S2 and an output. The buffer 454 includes an input connected to the output of the buffer 453 and an output to provide the signal R1. The NOR gate 455 includes an input connected to the output of the inverter 456, an input to receive the signal R1, and an output connected to the precharge input of the precharge module 475.

In operation, when the signal EN is negated, the precharge module 475 maintains the signal S2 in a negated state. When the signal EN is asserted, in response to a rising edge of the signal S1 the bit cell 470 asserts a signal provided via bit line 481 and negates a signal provided via bit line 482. In particular, an internal node of bit cell 470 is connected to a reference voltage $V_{DD}$, so that in response to the rising edge of the signal S1 the bit line 481 is charged to a voltage near $V_{DD}$, while the bit line 482 is set to a voltage near a ground reference voltage. The negated signal on bit line 482 causes a rising transition in signal S2. Thus, when signal EN is in the asserted state, a rising transition of the signal S1 results in a rising transition in signal S2.

In addition, the rising transition in signal S2 results in a delayed rising transition in signal R1. The delay depends on the delays associated with each of buffers 453 and 454. In response to the rising transition in signal R1, the precharge module 475 resets the local-bit-line 481 to a logic high state and causes a falling transition in signal S2.

In the illustrated embodiment of FIG. 4, the delay path 422 is configured based on an evaluate delay path of a memory. Accordingly, the delay associated with delay path 422 is substantially the same as the delay associated with the evaluate delay path. The characteristics of the signal SOUT are therefore indicative of the behavior of the memory under similar operating and process characteristics of the delay path 422.

Figure 5:
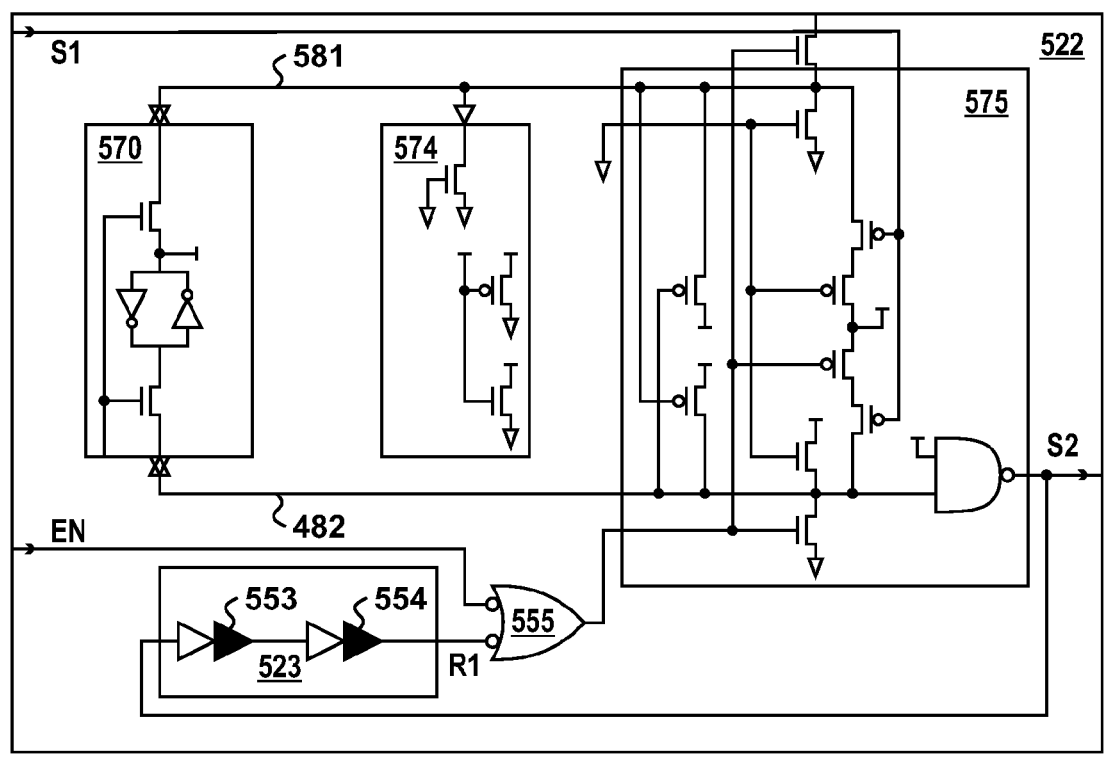
FIG. 5 is a circuit diagram of a delay path of the oscillator device of FIG. 1 in accordance with one embodiment of the present disclosure.

FIG. 5 illustrates a combined block and circuit diagram of a delay path 522, in accordance with one embodiment of the present disclosure. Delay path 522 includes bit cell 570, a dummy module 574, a precharge module 575, buffers 553 and 554, and a NAND gate 555. The bit cell 570 includes a terminal connected to a bit line 581 and each include a terminal connected to a bit line 582. The dummy module 574 includes a terminal connected to the bit line 581. The precharge module 575 includes an input connected to the bit line 581, an input connected to the bit line 582, a precharge input to receive the signal Si, an enable input, and an output to provide the signal S2. The buffer 553 includes an input to receive the signal S2 and an output. The buffer 554 includes an input connected to the output of the buffer 553 and an output to provide the signal R1. The NAND gate 555 includes an input to receive the signal R1, an input to receive the signal R1, and an output connected to the enable input of the precharge module 575.

In operation, when the signal EN is negated, the precharge module 575 maintains the signal S2 in an asserted state. When the signal EN is asserted, in response to a falling edge of the signal S1 precharge module 575 causes a falling in signal S2. Thus, when signal EN is in the asserted state, a falling transition of the signal S1 results in a falling transition in signal S2, thereby modeling the local-bit-line precharge behavior.

In addition, the falling transition in signal S2 results in a delayed falling transition in signal R1. The delay depends on the delays associated with each of buffers 553 and 554. In response to the falling transition in signal R1, the precharge module 575 causes a rising transition in signal S2.

In the illustrated embodiment of FIG. 5, the delay path 522 is configured based on an evaluate delay path of a memory. Accordingly, the delay associated with delay path 522 is substantially the same as the delay associated with the evaluate delay path. The characteristics of the signal SOUT are therefore indicative of the behavior of the memory under similar operating and process characteristics of the delay path 522.

Figure 6:
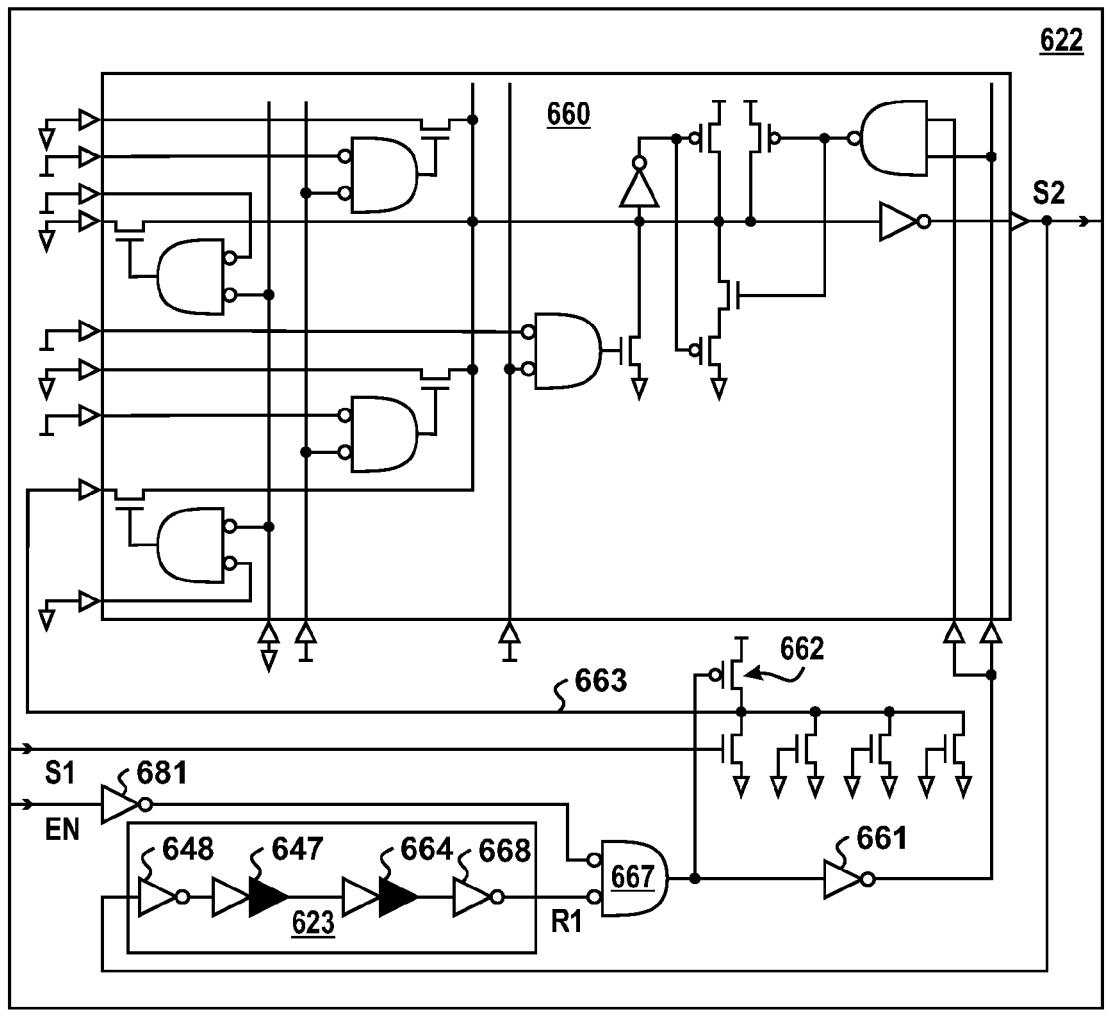
FIG. 6 is a circuit diagram of a delay path of the oscillator device of FIG. 1 in accordance with one embodiment of the present disclosure.

Referring to FIG. 6, a combined block and circuit diagram of a delay path 622, in accordance with one embodiment of the present disclosure, is illustrated. The delay path 622 includes a multiplexer 660, p-type transistor 662, n-type transistor 663, NOR gate 667, buffers 669 and 647, and inverters 661, 648, 668, and 681. The multiplexer 660 includes a first input, a second input, and an output to provide the signal S2. The inverter 681 includes an input to receive the signal EN and an output. The NOR gate 667 includes an input connected to the output of the inverter 681, an input to receive the signal R1, and an output. The inverter 661 includes an input connected to the output of the NOR gate 667 and an output connected to the first input of the multiplexer 660. The transistor 662 includes a current electrode connected to a reference voltage labeled VDD, a current electrode connected to the second input of the multiplexer 660, and a control electrode connected to the output of the NOR gate 667. The transistor 663 includes a current electrode connected to the second input of the multiplexer 660, a current electrode connected to a ground voltage reference, and a control electrode to receive the signal S1.

The inverter 648 includes an input to receive the signal S2 and an output. The buffer 647 includes an input connected to the output of the inverter 648 and an output. The buffer 669 includes an input connected to the output of the buffer 647 and an output. The inverter 668 includes an input connected to the output of the buffer 669 and an output to provide the signal R1.

In operation, when the signal EN is in a negated state the transistor 662 is conductive, which causes multiplexer 660 to place the signal S2 in a negated state. When signal EN is asserted, and in response to a rising transition of the signal S1, transistor 662 is non-conductive and transistor 663 is placed in a conductive state. In response, multiplexer 660 causes a rising transition in the signal S2. Accordingly, a rising transition in the signal S1 causes a rising transition in the signal S2.

In addition, the rising transition in signal S2 results in a delayed rising transition in signal R1. The delay depends on the delays associated with each of buffers 669 and 647 and the inverters 648 and 668. In response to the rising transition in signal R1, the transistor 662 becomes conductive, thereby causing a falling transition in signal S2.

In the illustrated embodiment of FIG. 6, the delay path 622 is configured based on an evaluate delay path of a memory selection module. In particular, the memory selection module can be employed to select from a number of bit lines of a memory. Accordingly, the delay associated with delay path 622 is substantially the same as the delay associated with the evaluate delay path of the memory selection module. The characteristics of the signal SOUT are therefore indicative of the behavior of the memory selection module under similar operating and process characteristics of the delay path 622.

Figure 7:
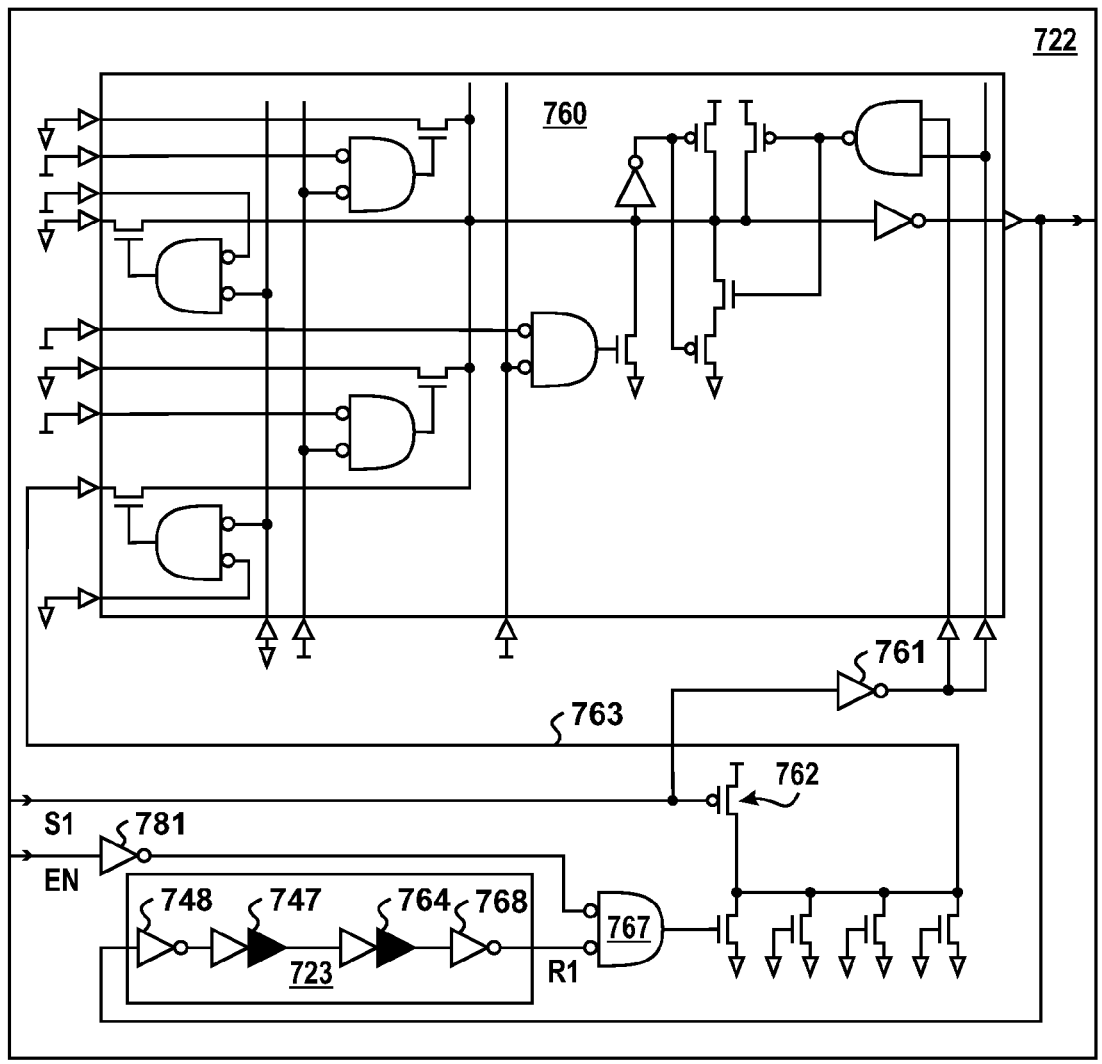
FIG. 7 is a circuit diagram of a delay path of the oscillator device of FIG. 1 in accordance with one embodiment of the present disclosure.

Referring to FIG. 7, a combined block and circuit diagram of a delay path 722, in accordance with one embodiment of the present disclosure, is illustrated. The delay path 722 includes a multiplexer 760, p-type transistor 762, n-type transistor 763, NAND gate 767, buffers 769 and 747, and inverters 761, 748, and 768. The multiplexer 760 includes a first input, a second input, and an output to provide the signal S2. The NAND gate 767 includes an input to receive the signal EN, an input to receive the signal R1, and an output. The inverter 761 includes an input to receive the signal S1 and an output connected to the first input of the multiplexer 760. The transistor 762 includes a current electrode connected to a reference voltage labeled $V_{DD}$, a current electrode connected to the second input of the multiplexer 760, and a control electrode to receive the signal S1. The transistor 763 includes a current electrode connected to the second input of the multiplexer 760, a current electrode connected to a ground voltage reference, and a control electrode connected to the output of the NAND gate 767.

The inverter 748 includes an input to receive the signal S2 and an output. The buffer 747 includes an input connected to the output of the inverter 748 and an output. The buffer 769 includes an input connected to the output of the buffer 747 and an output. The inverter 768 includes an input connected to the output of the buffer 769 and an output to provide the signal R1.

In operation, when the signal EN is in a negated state the transistor 763 is conductive, which causes multiplexer 760 to place the signal S2 in an asserted state. When signal EN is asserted, and in response to a falling transition of the signal S1, transistor 763 is non-conductive and transistor 762 is placed in a conductive state. In response, multiplexer 760 causes a falling transition in the signal S2. Accordingly, a falling transition in the signal S1 causes a falling transition in the signal S2.

In addition, the falling transition in signal S2 results in a delayed falling transition in signal R1. The delay depends on the delays associated with each of buffers 769 and 747 and the inverters 748 and 768. In response to the falling transition in signal R1, the transistor 763 becomes conductive, thereby causing a rising transition in signal S2.

In the illustrated embodiment of FIG. 7 the delay path 722 is configured based on a precharge delay path of a memory selection module. In particular, the memory selection module can be employed to select from a number of bit lines of a memory. Accordingly, the delay associated with delay path 722 is substantially the same as the delay associated with the precharge delay path of the memory selection module. The characteristics of the signal SOUT are therefore indicative of the behavior of the memory selection module under similar operating and process characteristics of the delay path 722.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:
1. A device, comprising:
a first oscillator device comprising:
a first plurality of stages including an initial stage and a final stage, each of the first plurality of stages comprising:
an input to receive an input signal;
an output to provide an output signal;

a first delay path coupled to the input and the output, the first delay path to provide, in response to a first signal transition at the input, a second signal transition at the output, the first signal transition and the second signal transition of the same transition type; and a reset module comprising an input connected to the output of the corresponding stage and an output coupled to the first delay path, the reset module configured to provide a reset signal in response to the second signal transition at the input of the reset module, the first delay path configured to provide a third signal transition at the output of the first delay path in response to the reset signal, the third signal transition of an opposite transition type to the first signal transition; and an output of the final stage coupled to an input of the initial stage.

2. The device of claim 1, further comprising:

a functional module comprising a second delay path, a configuration of the first delay path based on a configuration of the second delay path.

3. The device of claim 2, wherein the second delay path comprises a delay path used to precharge a node of the device.

4. The device of claim 2, wherein the second delay path comprises a delay path used to evaluate a logic state of a node of the device.

5. The device of claim 2, wherein the second delay path comprises a delay path configured to precharge a bitline of a memory module.

6. The device of claim 2, wherein the second delay path comprises a delay path configured to evaluate a bitline of a memory module.

7. The device of claim 2, further comprising:

a second oscillator device comprising:

a second plurality of stages including an initial stage and a final stage, each of the second plurality of stages comprising:

an input to receive an input signal;

an output to provide an output signal;

a second delay path coupled to the input and the output, the second delay path to provide a first signal transition at the output in response to a second signal transition at the input, the first signal transition and the second signal transition of a second transition type;

an output of the final stage coupled to an input of the initial stage.

8. The device of claim 7, wherein the second delay path is associated with a different delay than the first delay path.

9. The device of claim 7 wherein the first delay path is based a third delay path associated with a functional module of the device, and the second delay path is bases upon a fourth delay path associated with the functional module of the device.

10. The device of claim 9, wherein the third delay path comprises a delay path used to precharge a node of the device.

11. The device of claim 10, wherein the fourth delay path comprises a delay path used to evaluate the node.

12. The device of claim 1, wherein the first plurality of stages has an even number of stages.

13. A method, comprising:

in response to a first signal transition at a first input of a first stage of an oscillator device, providing a second signal transition at an output of the first stage, the first signal transition and the second signal transition being of a first type;

in response to receiving the second signal transition at a second input of a second stage of the oscillator device, providing a third signal transition at an output of the second stage, the third signal transition being of the first type;

in response to the third signal transition, providing a fourth signal transition at an output of a third stage of the oscillator device, the fourth signal transition being of the first type;

in response to receiving the fourth signal transition at the first input, providing a fifth signal transition at the output of the first stage, the fifth signal transition being of the first type;

in response to receiving the second signal transition at an input of a reset module, the input connected to the output of the first stage, providing a sixth signal transition at the output of the first stage a first period of time after the second signal transition. the sixth signal transition being of a second type.

14. The method of claim 13, further comprising:

providing a seventh signal transition at the output of the second stage a second period of time after the third signal transition, the seventh signal transition being of the second type, wherein a duration of the first period of time is substantially equal to a duration of the second period of time.

15. The method of claim 13, wherein the first stage corresponds to a first delay path, the first delay path corresponding to a second delay path of a functional module of an integrated circuit device.

16. The method of claim 15, wherein the second delay path corresponds to a precharge path for a memory module of the integrated circuit device.

17. The method of claim 15, wherein the second delay path corresponds to an evaluate path for a memory module of the integrated circuit device.

18. The method of claim 15, wherein a delay associated with the first delay path is different from a delay associated with the second delay path.

\* \* \* \* \*